US010236806B2

(12) United States Patent
Holzer et al.

(10) Patent No.: US 10,236,806 B2
(45) Date of Patent: Mar. 19, 2019

(54) POWER MODULE, POWER MODULE GROUP, POWER OUTPUT STAGE, AND DRIVE SYSTEM COMPRISING A POWER OUTPUT STAGE

(71) Applicant: Continental Automotive GmbH, Hannover (DE)

(72) Inventors: Harald Holzer, Regensburg (DE); Frank Meyer, Obertraubling (DE); Thomas Schmid, Regensburg (DE); Matthias Hammerl, Wolkering (DE); Gerald Hauer, Deuerling (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 0 days.

(21) Appl. No.: 15/516,498

(22) PCT Filed: Sep. 14, 2015

(86) PCT No.: PCT/EP2015/070935
§ 371 (c)(1),
(2) Date: May 18, 2017

(87) PCT Pub. No.: WO2016/050491
PCT Pub. Date: Apr. 7, 2016

(65) Prior Publication Data
US 2017/0279385 A1   Sep. 28, 2017

(30) Foreign Application Priority Data
Oct. 2, 2014   (DE) .................. 10 2014 219 998

(51) Int. Cl.
*H02P 6/14* (2016.01)
*H02M 1/088* (2006.01)
(Continued)

(52) U.S. Cl.
CPC .............. *H02P 6/14* (2013.01); *B60L 15/007* (2013.01); *H02J 3/12* (2013.01); *H02M 1/088* (2013.01);
(Continued)

(58) Field of Classification Search
CPC ........ H02M 7/537; B60L 3/003; H01L 25/07; H01L 24/49; H01L 23/34; H01L 29/68; H01L 23/53; H02P 9/48; H02P 9/305
(Continued)

(56) References Cited

U.S. PATENT DOCUMENTS 4,907,068 A  *  3/1990  Amann ............. H01L 23/49811
                                              257/687
5,748,456 A  *  5/1998  Bayerer ................ H01L 25/072
                                              257/678
(Continued)

FOREIGN PATENT DOCUMENTS

DE      19927285 A1   12/2000   ........... H01L 23/538
DE      10237561 C1   10/2003   ............ H01L 23/12
(Continued)

OTHER PUBLICATIONS

German Office Action, Application No. 102014219998.0, 9 pages, dated Oct. 5, 2015.
(Continued)

*Primary Examiner* — Rina I Duda
(74) *Attorney, Agent, or Firm* — Slayden Grubert Beard PLLC

(57) ABSTRACT

The present disclosure relates to electric motors. The teachings thereof may be embodied in a power module, e.g., a power module for the delivery of a phase current for a current phase of an electric motor. For example, a power module may include: a circuit carrier having a surface; at least two first contact surfaces, a second contact surface, at (Continued)

least two third contact surfaces defined on the surface; a first power transistor connected to each of the at least two first contact surfaces; at least two second power transistors connected to the second contact surface; wherein the at least two second power transistors are connected via a further contact surface to one of the at least two third contact surfaces; and the at least two first and the at least two third contact surfaces are arranged one after the other, in one direction, and the second contact surface is disposed next to both the at least two first and the at least two third contact surfaces.

15 Claims, 3 Drawing Sheets

(51) Int. Cl.
*H02M 7/00* (2006.01)
*B60L 15/00* (2006.01)
*H02J 3/12* (2006.01)
*H05K 1/18* (2006.01)
*H05K 7/14* (2006.01)

(52) U.S. Cl.
CPC ............ *H02M 7/003* (2013.01); *H05K 1/181* (2013.01); *H05K 7/1432* (2013.01); *H01L 2224/0603* (2013.01); *H01L 2224/4903* (2013.01); *H01L 2224/49111* (2013.01); *H01L 2224/49431* (2013.01); *H01L 2924/19107* (2013.01); *H05K 2201/10166* (2013.01)

(58) Field of Classification Search
USPC .......................................... 318/798, 800, 801
See application file for complete search history.

(56) References Cited

U.S. PATENT DOCUMENTS

| | | | | |
|---|---|---|---|---|
| 6,809,411 | B2 | 10/2004 | Hierholzer | .................... 257/678 |
| 7,224,145 | B2* | 5/2007 | Pierret | .................... F02N 11/04 |
| | | | | 322/25 |
| 7,227,259 | B2 | 6/2007 | Heilbronner et al. | ......... 257/724 |
| 7,560,887 | B2* | 7/2009 | Pierret | ....................... H02P 1/46 |
| | | | | 318/490 |
| 8,461,623 | B2 | 6/2013 | Nakata | ........................... 257/146 |
| 8,462,529 | B2* | 6/2013 | Ward | ...................... B60L 3/003 |
| | | | | 363/131 |
| 8,531,067 | B2* | 9/2013 | Tunzini | ................... H01L 24/49 |
| | | | | 310/64 |
| 9,325,257 | B2 | 4/2016 | Okayama | |
| 2011/0062491 | A1 | 3/2011 | Nakata | ........................... 257/146 |
| 2016/0172995 | A1 | 6/2016 | Obiraki et al. | ................ 361/728 |

FOREIGN PATENT DOCUMENTS

| | | | | |
|---|---|---|---|---|
| DE | 102008035233 A1 | 2/2009 | ............. | H02M 1/00 |
| DE | 102008018841 A1 | 10/2009 | ............. | H01L 21/60 |
| DE | 112009001638 T5 | 5/2011 | ............. | H01L 25/07 |
| JP | 2012186910 A | 9/2012 | ............. | H02M 3/00 |
| WO | 2013/128787 A1 | 9/2013 | ............. | H01L 25/07 |
| WO | 2013/179547 A1 | 12/2013 | ............. | H01L 23/48 |
| WO | 2016/050491 A1 | 4/2016 | ............. | H02M 1/088 |

OTHER PUBLICATIONS

International Search Report and Written Opinion, Application No. PCT/EP2015/070935, 19 pages, dated Feb. 2, 2016.
Chinese Office Action, Application No. 201580065876.7, 15 pages, dated Sep. 30, 2018.

* cited by examiner

POWER MODULE, POWER MODULE GROUP, POWER OUTPUT STAGE, AND DRIVE SYSTEM COMPRISING A POWER OUTPUT STAGE

CROSS-REFERENCE TO RELATED APPLICATIONS

This application is a U.S. National Stage Application of International Application No. PCT/EP2015/070935 filed Sep. 14, 2015, which designates the United States of America, and claims priority to DE Application No. 10 2014 219 998.0 filed Oct. 2, 2014, the contents of which are hereby incorporated by reference in their entirety.

TECHNICAL FIELD

The present disclosure relates to electric motors. The teachings thereof may be embodied in a power module, e.g., a power module for the delivery of a phase current for a current phase of an electric motor.

BACKGROUND

Power output stages, e.g., power output stages of the drive systems of hybrid electric/electric vehicles for the delivery of phase currents for current phases of an electric motor, incorporate power transistors, which deliver or conduct phase currents controlled by external control signals of current ratings of up to several hundred amperes, or even in excess of 500 amperes, to a down-circuit high-capacity load such as an electric motor of the drive system. Because of the physical properties of power output stages, or of power transistors in power output stages, stray induction currents occur in the power output stages, which can result in disturbances in the power output stages, or even in the failure of said output stages.

SUMMARY

The teachings of the present disclosure may provide an option for the reduction of stray induction currents in power output stages. The teachings may be embodied in a power module group with at least two power modules, and/or to a power output stage with at least three power module groups. Additional embodiments may include a drive system for the propulsion of a vehicle, having at least one aforementioned power output stage.

For example, a power module (LM, LM'), specifically for the delivery of a phase current to an electric motor, may include: a circuit carrier (ST) having a surface (OF); at least two first contact surfaces (KF11, KF12) on the surface (OF), upon which respectively a first power transistor (T11, T12) is directly arranged, which are respectively connected via a body-contact surface to the respective first contact surfaces (KF11, KF12) in an electrically conductive manner; a second contact surface (KF2) on the surface (OF), upon which at least two second power transistors (T21, T22) are directly arranged, which are respectively connected via a body-contact surface to the second contact surface (KF2) in an electrically conductive manner; at least two third contact surfaces (KF31, KF32) on the surface (OF), wherein the at least two second power transistors (T21, T22) are respectively connected via a further contact surface (S21, S22) to one of the at least two third contact surfaces (KF31, KF32) in an electrically conductive manner; wherein the at least two first (KF11, KF12) and the at least two third (KF31, KF32) contact surfaces are arranged alternatingly, one after the other, in one direction (LR), and the second contact surface (KF2) is arranged next to the at least two first (KF11, KF12) and the at least two third (KF31, KF32) contact surfaces.

In some embodiments, one of the at least two second power transistors (T21, T22) is arranged respectively next to one of the at least two third contact surfaces (KF31, KF32).

In some embodiments, the second contact surface (KF2) has at least two contact regions (B21, B22); wherein respectively one of the at least two contact regions (B21, B22) is arranged respectively next to one of the at least two first power transistors (T11, T12), and the at least two first power transistors (T11, T12) are respectively connected to the respective contact regions (B21, B22), in an electrically conductive manner, via a further contact surface (S11, S12).

In some embodiments, the at least two first contact regions (B21, B22) and the at least two second power transistors (T21, T22) are arranged alternatingly, one after the other, in the direction (LR).

In some embodiments, there is at least one connecting surface (VF1, VF2) on the surface (OF), which, as a protrusion on one of the at least two third contact surfaces (KF31), extends away from the corresponding third contact surface (KF31).

In some embodiments, the at least one connecting surface (VF2) extends from the corresponding third contact surface (KF31) to another of the at least two third contact surfaces (KF32) and directly interconnects said two third contact surfaces (KF31, KF32) in an electrically conductive manner.

In some embodiments, the at least one connecting surface (VF2) and the at least two third contact surfaces (KF31, KF32) are mutually configured in a one-piece arrangement.

In some embodiments, there is a fourth contact surface (KF4) on the surface (OF), which, as a protrusion on the second contact surface (KF2), extends away from the second contact surface (KF2) in the direction of the at least one connecting surface (VF2).

In some embodiments, the second (KF2) and the fourth (KF4) contact surface are mutually configured in a one-piece arrangement.

As another example, a power module group (LG), specifically for the delivery of a phase current to an electric motor, may include: at least two power modules (LM, LM') according to one of the preceding claims; a first conductor rail (SS1) which is directly connected to the respective second contact surfaces (KF2) of the at least two power modules (LM, LM') in an electrically conductive manner, and which mechanically interconnects the at least two power modules (LM, LM').

In some embodiments, there is a second conductor rail (SS2), which is directly connected to the respective first contact surfaces (KF11, KF12) of the at least two power modules (LM, LM') in an electrically conductive manner, and which mechanically interconnects the at least two power modules (LM, LM').

In some embodiments, there is a third conductor rail (SS3), which is connected to the respective third contact surfaces (KF31, KF32) of the at least two power modules (LM, LM') in an electrically conductive manner, and which mechanically interconnects the at least two power modules (LM, LM').

In some embodiments, there is at least one electrical connection (BD) which connects a connecting surface (VF2) of one of the at least two power modules (LM) directly with one of the third contact surfaces (KF32) of another of the at least two power modules (LM'), in an electrically conductive manner.

As another example, a power output stage (LS), specifically for the delivery of phase currents for current phases of an electric motor, may include: at least three power module groups (LG) as described above; a power capacitor (C), having a first electrode terminal and a second electrode terminal, and connected via the first electrode terminal to the respective second conductor rails (SS2) of the at least three power module groups (LG) and via the second electrode terminal to the respective third conductor rails (SS3) of the at least three power module groups (LG), in an electrically conductive manner.

As another example, a drive system for driving a vehicle may include at least one electric motor for driving the vehicle and at least one power output stage (LS) as described above for the delivery of phase currents to the at least one electric motor.

BRIEF DESCRIPTION OF THE DRAWINGS

Exemplary forms of embodiment of the invention are described in greater detail hereinafter, with reference to the following figures. In the figures.

DETAILED DESCRIPTION

Figure 1:
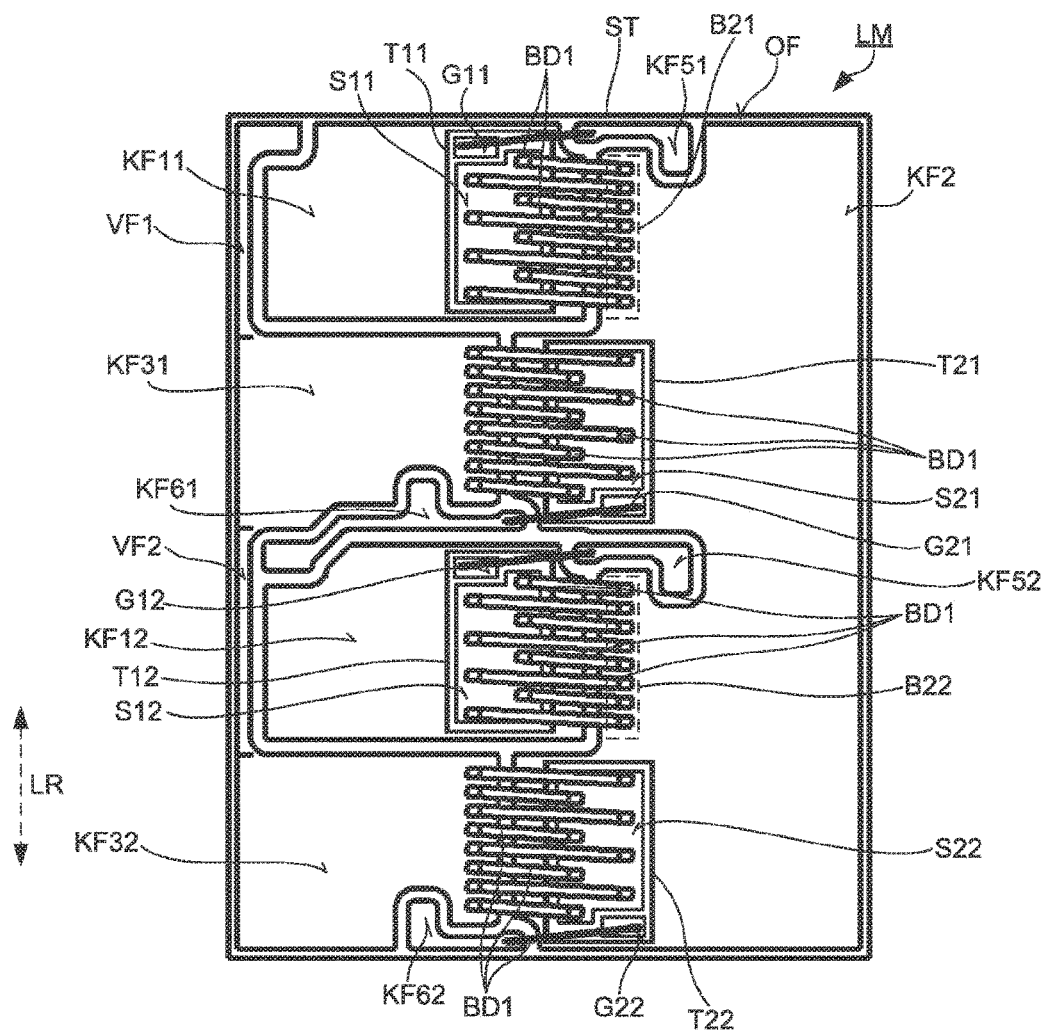
FIG. 1 shows a schematic representation of a power module according to the teachings of the present disclosure.

In some embodiments, there is a power module for the delivery of a phase current for a current phase of an electric motor. In general, the power module comprises a circuit carrier having a surface. On this surface, the power module includes at least two first contact surfaces for the formation of electrical contact.

The power module moreover includes at least two first power transistors, in each case in a distributed arrangement on the respective first contact surfaces. The at least two first power transistors are respectively connected via a body-contact surface to the respective first contact surfaces in an electrically conductive manner.

On the surface of the circuit carrier, the power module includes a second contact surface for the formation of electrical contact and at least two second power transistors, all of which are arranged on the second contact surface. The at least two second power transistors are respectively connected via a body-contact surface to the second contact surface in an electrically conductive manner.

In some embodiments, on the surface of the circuit carrier, the power module includes at least two third contact surfaces, which are also designed for the formation of electrical contact. The at least two second power transistors are respectively connected via a further contact surface (or reverse-side contact surface) with one of the at least two third contact surfaces in an electrically conductive manner.

In some embodiments, the at least two first and the at least two third contact surfaces here are arranged alternatingly (in mutual alternation), one after the other, in one direction, specifically in the longitudinal direction of the power module. The second contact surface (considered in the afore-mentioned direction) may be arranged next to the at least two first and the at least two third contact surfaces.

The circuit carrier may comprise a printed circuit board and/or a ceramic substrate, e.g., a DBC (direct bonded copper) substrate.

In some embodiments, the at least two first contact surfaces and the second contact surface and/or the at least two third contact surfaces may be two-dimensionally extended such that, on the respective contact surfaces, the respective power transistors can be directly contacted via the entire respective body-contact surfaces, in an electrically conductive manner.

Herein, the term "directly" signifies that the corresponding electrical connection between a power transistor and a contact surface is formed via the corresponding body-contact surface of the power transistor by means of an electrically-conductive welded or adhesive bond, or by means of a soldered connection, only using solder paste. Moreover, an electrically-conductive connection signifies a low-resistance or low-impedance electrical connection, wherein the resistance or impedance of the connection path is negligibly small.

The body-contact surface may include a two-dimensionally extended contact surface on the underside of a power transistor, which covers over 50%, e.g., over 80% of the total surface area of the underside. An example of a body-contact surface of this type is a base contact on a bare die (power transistor).

The at least two first power transistors and the at least two second power transistors may form the positive voltage-side and negative voltage-side power transistors or, conversely, the negative voltage-side and positive voltage-side power transistors of the power module. In some embodiments, the at least two first contact surfaces and the at least two third contact surfaces respectively thus form the positive voltage-side and negative voltage-side current connections, or the negative voltage-side and positive voltage-side current connections to the respective power transistors. Analogously, the second contact surface constitutes the current connection to the current phase of the electric motor.

The at least two first and the at least two third contact surfaces may be alternately arranged, one after the other, in a reference direction, specifically in the longitudinal direction, considered in respect of the power module. Considered in the reference direction of the power module, the second contact surface is arranged next to the at least two first and the at least two third contact surfaces, and extends in the reference direction of the power module from the height of a first contact surface arranged on an outer edge up to the height of a third contact surface arranged on another outer edge.

To reduce stray induction currents, the total induction surface area may be reduced. The span of the induction surface runs from the positive voltage-side power transistor to the negative voltage-side power transistor of one and the same current phase of a power module, and through which the current flows from the positive voltage-side power supply conductor via the positive voltage-side power transistor to the current phase, and back from the current phase via the negative voltage-side power transistor to the negative voltage-side power supply conductor. To reduce this total induction surface area, rather than a single large (or large-dimensioned) positive voltage-side power transistor, at least two smaller (or small-dimensioned) positive voltage-side power transistors may be used and, rather than a single large (or large-dimensioned) negative voltage-side power transistor, at least two smaller (or small-dimensioned) negative voltage-side power transistors are employed.

By the replacement of large power transistors with a plurality of smaller power transistors, electrical connections on and around the smaller power transistors, which are designed for the conduction of continuous currents, can also be dimensioned with reduced ratings. By the reduced dimensioning of power transistors, and of electrical connections on and around the power transistors, stray induction currents of lower intensities are generated which, in total, are lower than the stray induction currents associated with a power module having power transistors of a high rating.

By the alternating arrangement of the first and third contact surfaces, by means of which the respective positive and negative voltage-side power transistors are connected to their corresponding power supply conductors, the respective induction surface areas, which span between the respective positive and negative voltage-side power transistors, and consequently also the total induction surface area of the power module, are further reduced. Moreover, the total induction surface area of the power module, by the arrangement of the second contact surface which interconnects the positive voltage-side and the negative voltage-side power transistors and provides the electrical connection to the current phase of the electric motor, in addition to the first and third, e.g., the positive voltage-side and negative voltage-side contact surfaces, is further reduced.

Using the aforementioned power modules, a power output stage with lower overall stray induction currents can thus be provided. In some embodiments, one of the at least two second power transistors, considered in the aforementioned direction, is arranged respectively next to one of the at least two third contact surfaces, such that the induction surface areas which span from the respective power transistors to the corresponding third contact surfaces can be kept small.

The second contact surface may include at least two contact regions, wherein one of the at least two contact regions is arranged respectively next to one of the at least two first power transistors. The at least two first power transistors are respectively connected to the respective contact regions, in an electrically conductive manner, via a further contact surface.

In some embodiments, the at least two contact regions of the second contact surface and the at least two second power transistors are arranged alternatingly, one after the other, in the direction of the power module. By the mutually alternating arrangement of the first and third contact surfaces, and the mutually alternating arrangement of the two contact regions of the second contact surface and the at least two second power transistors in the direction of the power module, it is possible, respectively, for one of the two first power transistors (e.g. the "high-side" power transistors) and, respectively, one of the two second power transistors (e.g. the "low-side" power transistors), to be mutually paired in an alternating and adjacent arrangement, with small mutual clearances. In consequence, stray induction currents are again reduced.

In some embodiments, the power module, on the surface of the circuit carrier, is moreover provided with at least one connecting surface, which is configured as a protrusion on one of the at least two third contact surfaces, and which extends away from the corresponding third contact surface.

In some embodiments, the at least one connecting surface extends from the corresponding third contact surface to another of the at least two third contact surfaces, and directly interconnects said two third contact surfaces electrically. In some embodiments, the at least one connecting surface and the at least two third contact surfaces are mutually configured in a one-piece arrangement.

The at least one connecting surface may be arranged on one side of the surface of the circuit carrier which is averted from the second contact surface (arranged behind the third contact surfaces, considered from the second contact surface). On this at least one connecting surface, a current flowing through one of the at least two third contact surfaces or a voltage potential on one of the at least two third contact surfaces can be measured.

In some embodiments, the power module includes a fourth contact surface on the surface of the circuit carrier, which is configured as a protrusion on the second contact surface, and extends away from the second contact surface in the direction of the at least one connecting surface. The second and the fourth contact surface may be configured in a one-piece arrangement. Via the fourth contact surface, a current flowing through the second contact surface or a voltage potential on the second contact surface can be measured.

In some embodiments, there is a power module group for the delivery of a phase current for a current phase of an electric motor, comprising at least two of the aforementioned power modules. The power module group may include a first conductor rail directly connected to the respective second contact surfaces of the at least two power modules in an electrically conductive manner, and which mechanically interconnects the at least two power modules.

In some embodiments, the power module group comprises a second conductor rail, which is directly connected to the respective first contact surfaces of the at least two power modules in an electrically conductive manner, and which mechanically interconnects the at least two power modules.

In some embodiments, the power module group comprises a third conductor rail, which is connected to the respective third contact surfaces of the at least two power modules in an electrically conductive manner, and which mechanically interconnects the at least two power modules.

The conductor rails are two-dimensional and longitudinally-formed, e.g., stamped, electrically-conductive sheet components of a metal or a metal alloy, specifically of copper or a copper alloy. Embodiments including a second and third conductor rail permit the mutually alternating arrangement of power connections to the first and third contact surfaces of the two power modules which, in turn, may further reduce stray induction currents.

In some embodiments, there is an electrical connection which connects a connecting surface of one of the at least two power modules directly with one of the third contact surfaces of another of the adjoining at least two power modules, in an electrically conductive manner.

Embodiments with at least two power modules permit low production and maintenance costs for the power module groups, as, in the event of a defect on a power transistor in a power module, only the affected power module needs to be replaced, rather than an entire power module group. Moreover, the second and third conductor rails, and the electrical connection between the two power modules, permit the formation of common inter- and intra-substrate bonds, which can be formed in a single bonding process.

In some embodiments, there is a power output stage for the delivery of phase currents for current phases of an electric motor, comprising at least three of the aforementioned power module groups. Herein, the first conductor rails of the at least three power module groups connect the power module groups with the respective current phases of the electric motor in an electrically conductive manner.

In some embodiments, the power output stage comprises a power capacitor, having a first electrode terminal and a second electrode terminal, and connected via the first electrode terminal to the respective second conductor rails of the at least three power module groups and via the second electrode terminal to the respective third conductor rails of the at least three power module groups, in an electrically conductive manner.

Some embodiments may include a drive system for a vehicle, e.g., a hybrid electric/electric vehicle, comprising at least one electric motor for driving the vehicle and at least one aforementioned power output stage for the delivery of phase currents for the current phases of the at least one electric motor.

FIG. 1 shows a schematic overhead view of a power module LM for the delivery of a phase current for a current phase of an electric motor, according to teachings of the present invention. The power module LM comprises a circuit carrier ST, e.g., a ceramic substrate (DBC substrate). The circuit carrier ST has a surface OF upon which a first group of two first electrical contact surfaces KF11, KF12, a second electrical contact surface KF2 and a second group of two third electrical contact surfaces KF31, KF32, formed of copper, are arranged as part of the printed conductor structure.

The first and third contact surfaces KF11, KF12 and KF31, KF32 here are alternating on the left-hand half (from the viewpoint of an observer of the figure) of the surface OF of the circuit carrier ST, and arranged one after the other in the longitudinal direction LR thereof. The first and third contact surfaces KF11, KF12 and KF31, KF32 have a two-dimensionally extended configuration, and have approximately the same surface area. Together, they cover over 70% of the left-hand half of the surface OF.

The second contact surface KF2, considered in the longitudinal direction LR, is next to the first and third contact surfaces KF11, KF12, KF31, KF32, and thus on the right-hand half (from the viewpoint of an observer of the figure) of the surface OF. The second contact surface KF2 here extends in the longitudinal direction LR from one end to the other end of the circuit carrier ST, or from a first contact surface KF11 located on the outer edge of the surface OF to a third contact surface KF32 which is likewise located on the outer edge of the surface OF. The second contact surface KF2 likewise has a two-dimensionally extended configuration, and covers over 80% of the right-hand half of the surface OF.

The function of the two first contact surfaces KF11, KF12 is the formation of electrical connections between a positive power supply conductor and the drain terminals of two first positive voltage-side power MOSFETs T11, T12, which are described hereinafter. The second contact surface KF2 serves to form electrical contact between the power module LM and one current phase of the electric motor, wherein the latter electrically interconnects the source terminals S11, S12 of the aforementioned positive voltage-side power MOSFETs T11, T12 and the drain terminals of second negative voltage-side power MOSFETs T21, T22, described hereinafter, together with the current phase of the electric motor.

Analogously to the first contact surfaces KF11, KF12, the two third contact surfaces KF31, KF32 form electrical connections between the respective source terminals S21, S22 of the second power MOSFETs T21, T22 and a negative power supply conductor.

On the surface OF of the circuit carrier ST, the power module LM moreover has two connecting surfaces VF1, VF2, each configured as a protrusion on the respective third contact surfaces KF31, KF32, configured in a one-piece arrangement with the respective third contact surfaces KF31, KF32, and extending from the respective third contact surfaces KF31, KF32 in the longitudinal direction LR of the circuit carrier ST. Herein, one of the two connecting surfaces VF2 extends from one third contact surface KF32 to the other third contact surface KF31, and interconnects said two third contact surfaces KF31, KF32 in a one-piece arrangement.

The two connecting surfaces VF1, VF2 are located in a region of the surface OF which is averted from the second contact surface KF2.

Between the respective first contact surfaces KF11, KF12 and the second contact surface KF2, the power module LM respectively has a fifth contact surface KF51, KF52, designed for the formation of electrical connections between external control signal terminals and the respective gate terminals G11, G12 of the positive voltage-side power MOSFETs T11, T12. Between the respective third contact surfaces KF31, KF32 and the second contact surface KF2, the power module LM respectively has a sixth contact surface KF61, KF62 which, analogously to the fifth contact surfaces KF51, KF52, is designed for the formation of electrical connections between external control signal terminals, which are not represented in the figure, and the respective gate terminals G21, G22 of the negative voltage-side power MOSFETs T21, T22. Optionally, one of the sixth contact surfaces KF61 is configured to extend longitudinally away from the second contact surface KF2 in the direction of one of the connecting surfaces VF2, and has a contact region, via which an external control signal for the control of the negative voltage-side power MOSFETs T21, T22 can be applied.

The power module LM moreover comprises two of the aforementioned positive voltage-side power MOSFETS T11, T12, which are configured as bare dies. On their respective base side, the positive voltage-side power MOSFETs T11, T12 incorporate the drain terminal, configured as a two-dimensionally extended base contact (or body contact). On their respective reverse side, the positive voltage-side power MOSFETs T11, T12 incorporate the source terminal S11, S12, which is configured as a two-dimensionally extended reverse side contact, and the gate terminal G11, G12.

In FIG. 1, the drain terminals of the positive voltage-side power MOSFETs T11, T12 are not visible, as these are located on the base side, and are thus on the side of the respective power MOSFETs T11, T12 which is averted from an observer of the figure.

The two positive voltage-side power MOSFETs T11, T12 respectively are arranged directly on one of the respective first contact surfaces KF11, KF12 and, via their respective drain terminals, are directly connected to the respective first contact surfaces KF11, KF12, in an electrically conductive manner, by means of solder paste only (in a chip on board arrangement). Via the respective source terminals S11, S12, the power MOSFETs T11, T12 are respectively connected in an electrically conductive manner, by means of bonded connections BD1, with one of two contact regions B21, B22 of the second contact surface KF2, wherein the two contact regions B21, B22 are respectively located next to the respective power MOSFETs T11, T12. Via the respective gate terminals G11, G12, the power MOSFETs T11, T11 are respectively connected in an electrically conductive manner, by means of further bonded connections BD1, with one of the two fifth contact surfaces KF51, KF52.

The power module LM moreover comprises two of the aforementioned negative voltage-side power MOSFETs T21, T22, also configured as bare dies and incorporating, on their respective base side, the drain terminal, configured as a two-dimensionally extended base contact and, on their respective reverse side, the source terminal S21, S22 and the gate terminal G21, G22, configured as a two-dimensionally extended reverse side contact. In FIG. 1, the drain terminals of the negative voltage-side power MOSFETs T21, T22 are likewise not visible, as these are located on the base side, and are thus on the side of the respective power MOSFETs T21, T22 which is averted from an observer of the figure.

The two negative voltage-side power MOSFETs T21, T22 respectively are directly arranged on the second contact surface KF2 and, via their respective drain terminals, are directly connected to the second contact surface KF2 in an electrically conductive manner, by means of solder paste only. Herein, the two negative voltage-side power MOSFETs T21, T22 (considered in the longitudinal direction LR of the power module LM) are respectively next to one of the two third contact surfaces KF31, KF32. By means of bonded connections BD1, via the respective source terminals S21, S22, the negative voltage-side power MOSFETs T21, T22 are respectively connected in an electrically conductive manner to one of the two third contact surfaces KF31, KF32. By means of bonded connections BD1, via the respective gate terminals G21, G22, the power MOSFETs T21, T22 are respectively connected in an electrically conductive manner to one of the two sixth contact surfaces KF61, KF62.

Considered in the longitudinal direction LR, the two negative voltage-side power MOSFETs T21, T22, and the aforementioned two contact regions B21, B22 of the second contact surface KF2 are arranged in an alternating manner, one after the other.

Figure 2:
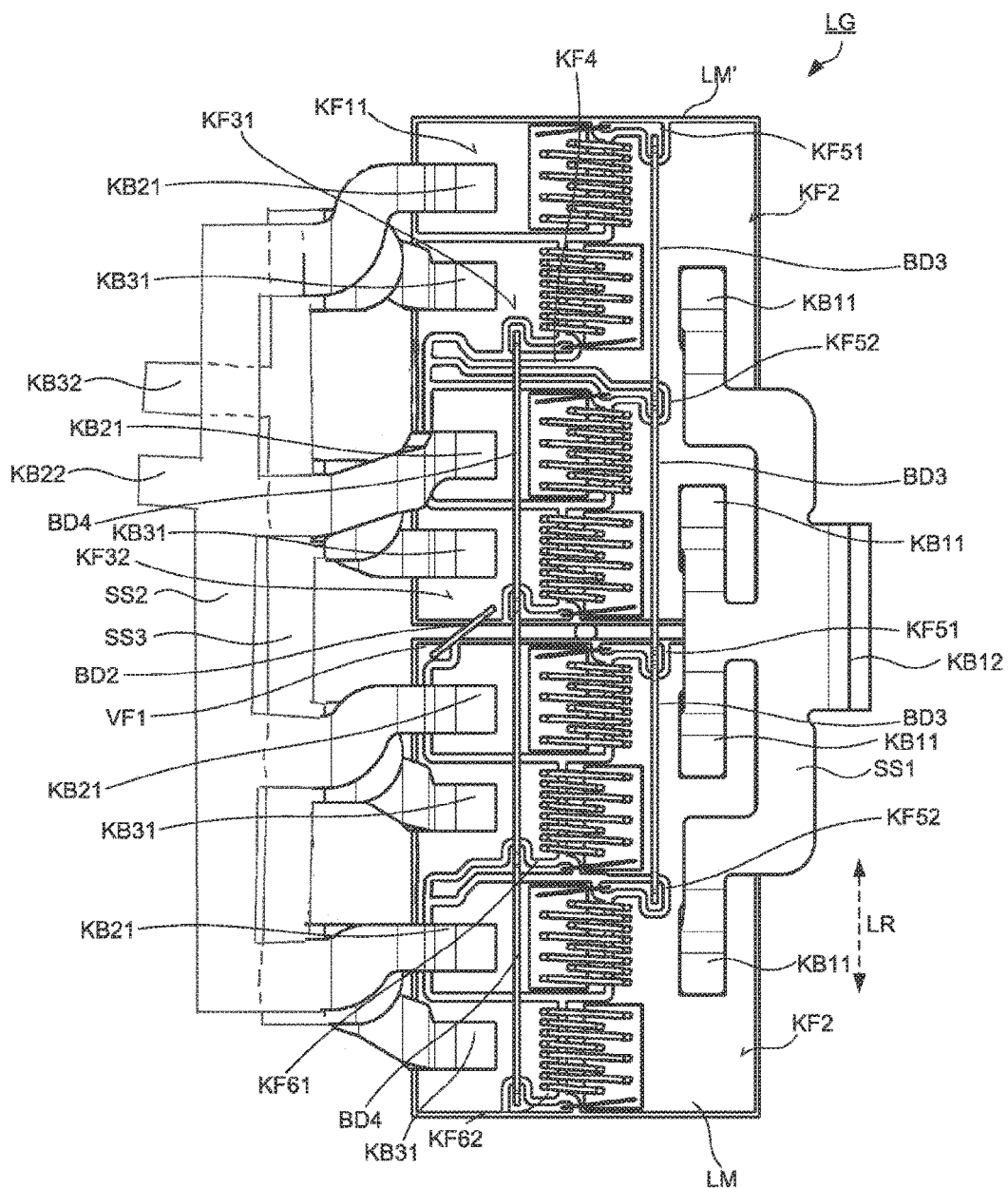
FIG. 2 shows a schematic representation of a power module group having a power module represented in FIG. 1.

FIG. 2 shows a power module group LG for delivering a phase current for a current phase of the aforementioned electric motor. The power module group LG comprises two power modules LM, LM', of which one power module LM is already represented in FIG. 1. A further power module LM' differs from the power module LM represented in FIG. 1, amongst other aspects, in that it has only one connecting surface VF2, arranged between the two third contact surfaces KF31, KF32, and configured with the two third contact surfaces KF31, KF32 in a one-piece arrangement.

The two power modules LM, LM', considered in their longitudinal direction LR, are arranged one after the other.

As can be seen in FIG. 2, the power module LM' includes a fourth contact surface KF4 configured on the surface OF of the circuit carrier ST as a protrusion of the second contact surface KF2, and extends from the second contact surface KF2, between a first contact surface KF12 and a third contact surface KF31 which is adjacent to said first contact surface KF12, in the direction of the connecting surface VF2 which interconnects the two third contact surfaces KF31, KF32 in a one-piece arrangement. The fourth contact surface KF4 here terminates shortly ahead of the connecting surface VF2, and is thus electrically isolated from the connecting surface VF2. The power module group LG comprises a first conductor rail SS1, which is essentially of comb-shaped design, having four exposed contact legs KB11 on one side, and a fifth contact leg KB12 on the other side of the conductor rail SS1. Via two of the four exposed contact legs KB11 respectively on one side, the first conductor rail SS1 is connected to the respective second contact surface KF2 of the two power modules LM, LM', by means of solder paste, in an electrically conductive and mechanically bonding manner. The function of the fifth contact leg KB12 on the first conductor rail SS1 is to form the electrical connection of the power module group LG to the current phase of the electric motor (see FIG. 3).

The power module LG comprises a second conductor rail SS2 of comb-shaped design, having four exposed contact legs KB21 on one side and a fifth contact leg KB22 on the other side. Via the four contact legs KB21 on the one side, the second conductor rail SS2 is connected to the respective first contact surfaces KF11, KF12 of the two power modules LM, LM', by means of solder paste, in an electrically conductive and mechanically bonding manner. The function of the fifth contact leg KB22 on the second conductor rail SS2 is to form the electrical connection of the power module group LG to an external positive power supply conductor (see FIG. 3).

In some embodiments, the power module group LG comprises a third conductor rail SS3 which, analogously to the second conductor rail SS2, also has four exposed contact legs KB31 on one side, and a fifth contact leg KB32 on the other side. Via the four contact legs KB31 on one side, the third conductor rail SS3 is connected to the respective third contact surfaces KF31, K32 of the two power modules LM, LM', by means of solder paste, in an electrically conductive and mechanically bonding manner. The function of the fifth contact leg KB32 on the third conductor rail SS3 is to form the electrical connection of the power module group LG to an external negative power supply conductor (see FIG. 3).

The connecting surface VF1 of the one power module LM located on the outer edge is connected in an electrically conductive manner via a bonded connection BD2 to the third contact surface KF32 of the other power module LM', also located on the outer edge. This bonded connection BD2 serves to equalize the voltage potentials on the respective third contact surfaces KF31, KF32 of the two power modules LM, LM', such that the source currents of the low voltage-side power transistors T21, T22 of the two power modules LM, LM' flowing through the third contact surfaces KF31, KF32 of the two power modules LM, LM', or the voltage potential applied at the source terminals S21, S22 of the two low voltage-side power transistors T21, T22 can be measured at a desired measuring point on one of the third contact surfaces KF31, KF32 or on one of the connecting surfaces VF1, VF2 of the two power modules LM, LM'.

The fifth contact surfaces KF51, KF52 of the two power modules LM, LM' are interconnected in an electrically conductive manner by means of further bonded connections BD3. Via these bonded connections BD3, the control signal for the control of the positive voltage-side power transistors T11, T12 is applied to the respective gate terminals G11, G12 thereof.

Analogously, the sixth contact surfaces KF61, KF62 of the two power modules LM, LM' are interconnected in an electrically conductive manner by means of further bonded connections BD4. Via these bonded connections BD4, the control signal for the control of the negative voltage-side power transistors T11, T12 is applied to the respective gate terminals G21, G22 thereof.

Figure 3:
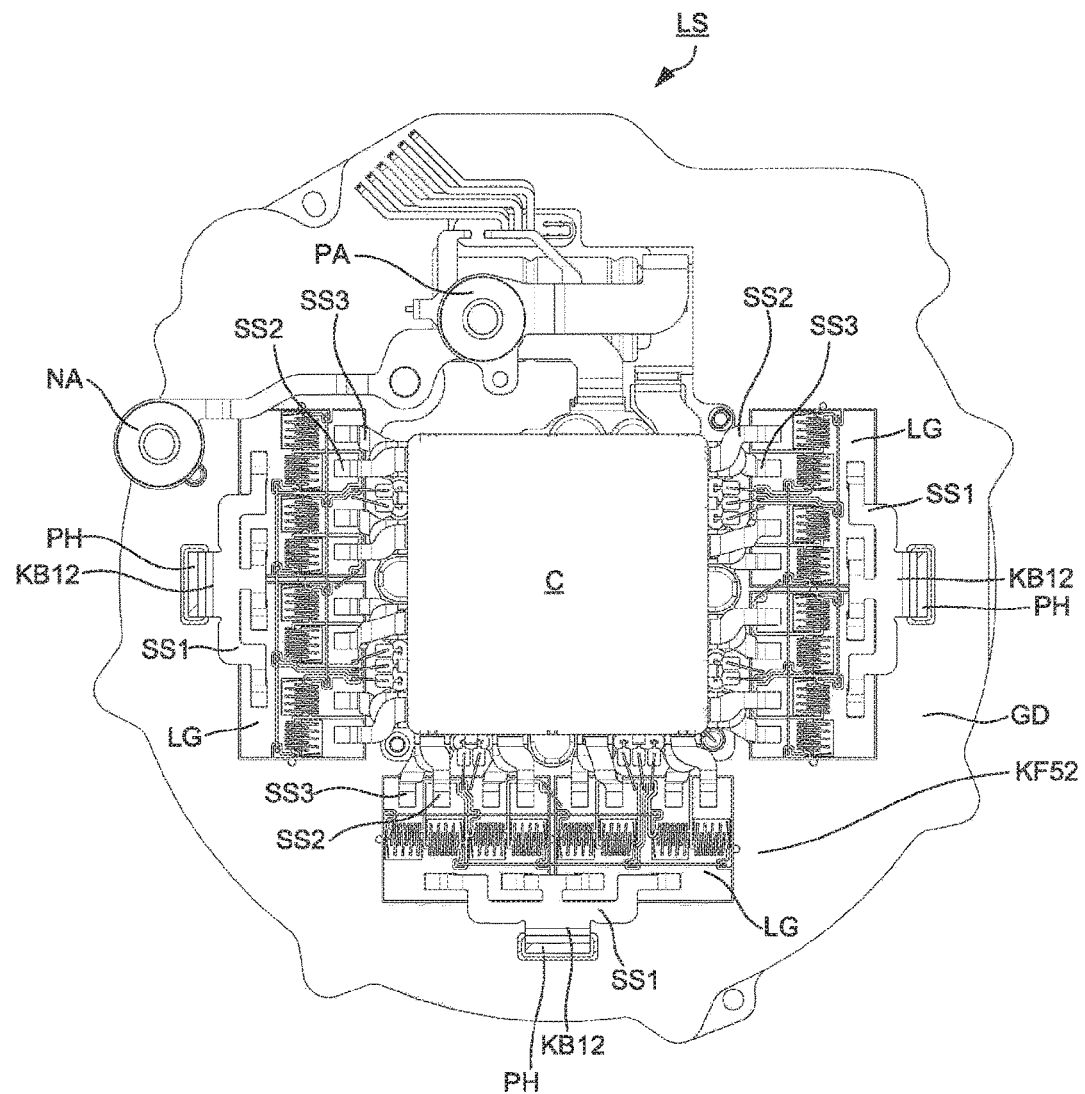
FIG. 3 shows a schematic representation of a power output stage having three of the power module groups represented in FIG. 2.

FIG. 3 shows a power output stage LS for the delivery of three phase currents for three current phases of the aforementioned electric motor, deployed on a housing cover GD of the electric motor. The power output stage LS comprises a power capacitor C, which is centrally arranged and secured on the housing cover GD. The power capacitor C comprises a first, positive electrode terminal and a second, negative electrode terminal. Via the positive electrode terminal, the power capacitor C is electrically bonded to a positive power terminal PA on the power output stage LS, which is electrically connected to a positive power supply conductor, which is not represented in the figure. Via the negative electrode terminal, the power capacitor C is electrically bonded to a negative power terminal NA on the power output stage LS, which is electrically connected to a negative power supply conductor.

The power output stage LS may comprise three power module groups LG, represented in FIG. 2, for the respective delivery of the three phase currents, wherein the three power module groups LG are distributed around the power capacitor C on the housing cover GD and secured thereto.

The three power module groups LG are respectively connected via the exposed fifth contact leg KB22 of the respective second conductor rail SS2 to the positive electrode terminal of the power capacitor C, and thus to the positive power terminal PA of the power output stage LS in an electrically conductive manner.

Analogously, the three power module groups LG are respectively connected via the fifth contact leg KB32 of the respective third conductor rail SS3 to the negative electrode terminal of the power capacitor C, and thus to the negative power terminal NA of the power output stage LS in an electrically conductive manner.

Moreover, the three power module groups LG are respectively connected via the fifth contact leg KB12 of the respective first conductor rail SS1 to one of three phase terminals PH of the power output stage LS in an electrically conductive manner, which are respectively electrically connected to one of the three current phases of the electric motor.

What is claimed is:

1. A power module for the delivery of a phase current to an electric motor, the power module comprising:
    a circuit carrier having a surface with a longitudinal extent;
    at least two first contact surfaces, a second contact surface, at least two third contact surfaces defined on the surface;
    a first power transistor directly arranged on each of the at least two first contact surfaces, respectively connected via a body-contact surface in an electrically conductive manner;
    at least two second power transistors directly arranged on the second contact surface, respectively connected via a body-contact surface in an electrically conductive manner;
    wherein the at least two second power transistors are respectively connected via a further contact surface to one of the at least two third contact surfaces in an electrically conductive manner;
    wherein the at least two first contact surfaces and the at least two third contact surfaces are arranged alternatingly, one after the other, along the longitudinal extent, such that the first power transistors and the second power transistors are arranged alternatingly along the longitudinal extent, and the second contact surface extends along the longitudinal extent next to both the at least two first contact surfaces and the at least two third contact surfaces.

2. The power module as claimed in claim 1, wherein one of the at least two second power transistors is disposed next to one of the at least two third contact surfaces.

3. The power module as claimed in claim 1, wherein:
    the second contact surface includes at least two contact regions;
    one of the at least two contact regions is disposed next to one of the at least two first power transistors; and
    the at least two first power transistors are respectively connected to the respective contact regions in an electrically conductive manner, via a further contact surface.

4. The power module as claimed in claim 3, wherein the at least two first contact regions and the at least two second power transistors are arranged one after the other in the direction.

5. The power module as claimed in claim 1, further comprising at least one connecting surface on the surface forming a protrusion on one of the at least two third contact surfaces extending away from the corresponding third contact surface.

6. The power module as claimed in claim 5, wherein the at least one connecting surface extends from the corresponding third contact surface to another of the at least two third contact surfaces and directly connects the two third contact surfaces in an electrically conductive manner.

7. The power module as claimed in claim 5, wherein the at least one connecting surface and the at least two third contact surfaces are each a one-piece arrangement.

8. The power module as claimed in claim 5, further comprising a fourth contact surface on the surface forming a protrusion on the second contact surface extending away from the second contact surface in the direction of the at least one connecting surface.

9. The power module as claimed in claim 8, further comprising the second and the fourth contact surface each configured in a one-piece arrangement.

10. A power module group for the delivery of a phase current to an electric motor, the power module group comprising:
    at least two power modules each comprising:
        a circuit carrier having a surface with a longitudinal extent;
        at least two first contact surfaces, a second contact surface, at least two third contact surfaces defined on the surface;
        a first power transistor directly arranged on each of the at least two first contact surfaces, respectively connected via a body-contact surface in an electrically conductive manner;
        at least two second power transistors directly arranged on the second contact surface, respectively connected via a body-contact surface in an electrically conductive manner;
        wherein the at least two second power transistors are respectively connected via a further contact surface to one of the at least two third contact surfaces in an electrically conductive manner;
        wherein the at least two first contact surfaces and the at least two third contact surfaces are arranged alternatingly, one after the other, along the longitudinal extent, such that the first power transistors and the second power transistors are arranged alternatingly along the longitudinal extent, and the second contact surface extends along the longitudinal extent next to both the at least two first contact surfaces and the at least two third contact surfaces; and
    a first conductor rail directly connected to the respective second contact surfaces of both of the at least two power modules in an electrically conductive manner, and mechanically connecting the at least two power modules.

11. The power module group as claimed in claim 10, further comprising a second conductor rail directly connected to the respective first contact surfaces of each of the at least two power modules in an electrically conductive manner, and mechanically connecting the at least two power modules.

12. The power module group as claimed in claim 10, further comprising a third conductor rail connected to each of the respective third contact surfaces of the at least two power modules in an electrically conductive manner, and mechanically connecting the at least two power modules.

13. The power module group as claimed in claim 10, further comprising at least one electrical connection between a surface of one of the at least two power modules and one of the third contact surfaces of another of the at least two power modules, in an electrically conductive manner.

14. A power output stage for the delivery of phase currents for current phases of an electric motor, the power output stage comprising:
- at least three power module groups, each comprising:
- at least two power modules each comprising:
  - a circuit carrier having a surface with a longitudinal extent;
  - at least two first contact surfaces, a second contact surface, at least two third contact surfaces defined on the surface;
  - a first power transistor directly arranged on each of the at least two first contact surfaces, respectively connected via a body-contact surface in an electrically conductive manner;
  - at least two second power transistors directly arranged on the second contact surface, respectively connected via a body-contact surface in an electrically conductive manner;
  - wherein the at least two second power transistors are respectively connected via a further contact surface to one of the at least two third contact surfaces in an electrically conductive manner;
  - wherein the at least two first contact surfaces and the at least two third contact surfaces are arranged alternatingly, one after the other, along the longitudinal extent, and the second contact surface extends along the longitudinal extent next to both the at least two first contact surfaces and the at least two third contact surfaces; and
- a first conductor rail directly connected to the respective second contact surfaces of both of the at least two power modules in an electrically conductive manner, and mechanically connecting the at least two power modules;
- a power capacitor with a first electrode terminal and a second electrode terminal and connected via the first electrode terminal to the respective second conductor rails of the at least three power module groups and via the second electrode terminal to the respective third conductor rails of the at least three power module groups, in an electrically conductive manner.

15. A drive system for driving a vehicle, the drive system comprising:
- at least one electric motor for driving the vehicle; and
- at least one power output stage for the delivery of phase currents to the at least one electric motor;
- each power output stage comprising:
- at least three power module groups, each comprising:
- at least two power modules each comprising:
  - a circuit carrier having a surface with a longitudinal extent;
  - at least two first contact surfaces, a second contact surface, at least two third contact surfaces defined on the surface;
  - a first power transistor directly arranged on each of the at least two first contact surfaces, respectively connected via a body-contact surface in an electrically conductive manner;
  - at least two second power transistors directly arranged on the second contact surface, respectively connected via a body-contact surface in an electrically conductive manner;
  - wherein the at least two second power transistors are respectively connected via a further contact surface to one of the at least two third contact surfaces in an electrically conductive manner;
  - wherein the at least two first contact surfaces and the at least two third contact surfaces are arranged alternatingly, one after the other, along the longitudinal extent, and the second contact surface extends along the longitudinal extent next to both the at least two first contact surfaces and the at least two third contact surfaces; and
- a first conductor rail directly connected to the respective second contact surfaces of both of the at least two power modules in an electrically conductive manner, and mechanically connecting the at least two power modules;
- a power capacitor with a first electrode terminal and a second electrode terminal and connected via the first electrode terminal to the respective second conductor rails of the at least three power module groups and via the second electrode terminal to the respective third conductor rails of the at least three power module groups, in an electrically conductive manner.

* * * * *